United States Patent
Arnold et al.

(10) Patent No.: US 9,761,669 B1
(45) Date of Patent: Sep. 12, 2017

(54) SEED-MEDIATED GROWTH OF PATTERNED GRAPHENE NANORIBBON ARRAYS

(71) Applicant: Wisconsin Alumni Research Foundation, Madison, WI (US)

(72) Inventors: Michael Scott Arnold, Middleton, WI (US); Austin James Way, Madison, WI (US); Robert Michael Jacobberger, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 15/212,413

(22) Filed: Jul. 18, 2016

(51) Int. Cl.
| | |
|---|---|
| *H01L 29/00* | (2006.01) |
| *H01L 21/00* | (2006.01) |
| *H01L 29/16* | (2006.01) |
| *H01L 29/04* | (2006.01) |
| *H01L 21/02* | (2006.01) |
| *H01L 21/683* | (2006.01) |

(52) U.S. Cl.
CPC ...... *H01L 29/1606* (2013.01); *H01L 21/0259* (2013.01); *H01L 21/0262* (2013.01); *H01L 21/02425* (2013.01); *H01L 21/02433* (2013.01); *H01L 21/02527* (2013.01); *H01L 21/02609* (2013.01); *H01L 21/02645* (2013.01); *H01L 21/6835* (2013.01); *H01L 29/045* (2013.01); *H01L 2221/68363* (2013.01)

(58) Field of Classification Search
CPC ......... H01L 21/02645; H01L 21/02433; H01L 21/02527; H01L 21/0262; H01L 21/02609; H01L 21/02425; H01L 21/6835; H01L 21/0259; H01L 29/1606; H01L 29/045; H01L 29/78684; H01L 2221/68363

See application file for complete search history.

(56) References Cited

U.S. PATENT DOCUMENTS

| | | | |
|---|---|---|---|
| 9,287,359 | B1 | 3/2016 | Arnold et al. |
| 9,324,804 | B2 | 4/2016 | Lagally et al. |
| 2010/0200840 | A1 | 8/2010 | Anderson et al. |
| 2010/0255219 | A1 | 10/2010 | Wenxu et al. |
| 2011/0114919 | A1 | 5/2011 | Jenkins et al. |
| 2011/0244662 | A1 | 10/2011 | Lee et al. |
| 2012/0003438 | A1 | 1/2012 | Appleton et al. |

(Continued)

FOREIGN PATENT DOCUMENTS

| | | |
|---|---|---|
| EP | 2540662 | 1/2013 |
| JP | 2012-172065 | 9/2012 |

OTHER PUBLICATIONS

Lippert et al., Graphene Grown on Ge(001) from Atomic Source, Obtained online from Cornell University Library, published prior to Mar. 21, 2014.

(Continued)

*Primary Examiner* — Nikolay Yushin
(74) *Attorney, Agent, or Firm* — Bell & Manning, LLC

(57) ABSTRACT

Graphene nanoribbon arrays, methods of growing graphene nanoribbon arrays, and electronic and photonic devices incorporating the graphene nanoribbon arrays are provided. The graphene nanoribbons in the arrays are formed using a seed-mediated, bottom-up, chemical vapor deposition (CVD) technique in which the (001) facet of a semiconductor substrate and the orientation of the seed particles on the substrate are used to orient the graphene nanoribbon crystals preferentially along a single [110] direction of the substrate.

21 Claims, 8 Drawing Sheets

(56) References Cited

U.S. PATENT DOCUMENTS

| | | |
|---|---|---|
| 2012/0068157 A1 | 3/2012 | Kub |
| 2012/0085991 A1 | 4/2012 | Cohen et al. |
| 2012/0141799 A1 | 6/2012 | Kub et al. |
| 2012/0181507 A1 | 7/2012 | Dimitrakopoulos et al. |
| 2012/0261644 A1 | 10/2012 | Dimitrakopoulos |
| 2013/0027778 A1 | 1/2013 | Currie et al. |
| 2013/0099195 A1 | 4/2013 | Seacrist et al. |
| 2013/0099205 A1 | 4/2013 | Liu et al. |
| 2013/0108839 A1 | 5/2013 | Arnold et al. |
| 2013/0160701 A1 | 6/2013 | Arnold et al. |
| 2014/0264281 A1 | 9/2014 | Niyogi et al. |
| 2015/0037048 A1 | 2/2015 | Na et al. |

OTHER PUBLICATIONS

T. Wogan, Growing great graphene on germanium, Chemistry World, http://www.rsc.org/chemistryworld/2014/04/growing-great-graphene-germanium-defect-free-electronics, Apr. 3, 2014.

Lee et al., Wafer-Scale Growth of Single-Crystal Monolayer Graphene on Reusable Hydrogen-Terminated Germanium, Science, vol. 344, Apr. 3, 2014, pp. 286-289.

Wang et al., Direct Growth of Graphene Film on Germanium Substrate, Scientific Reports, vol. 3, No. 2465, Aug. 19, 2013.

Prabhakaran et al., Distinctly different thermal decomposition pathways of ultrathin oxide layer on Ge and Si surfaces, Applied Physics Letters, vol. 76, No. 16, Apr. 17, 2000, pp. 2244-2246.

Nazarenkov et al., Mechanism of photo-stimulated processes in GeOx films, Thin Solid Films, vol. 254, 1995, pp. 164-168.

A. Toriumi, Recent Progress of Germanium MOSFETs, 2012 IEEE International Meeting for Future of Electron Devices, Kansai (IMFEDK), Osaka, May 9, 2012, pp. 1-2.

Wang et al., Germanium nanowire field-effect transistors with $SiO_2$ and high-k $HfO_2$ gate dielectrics, Applied Physics Letters, vol. 83, No. 12, Sep. 22, 2003, pp. 2432-2434.

K. Saraswat, Novel Electronic and Optoelectronic Devices in Germanium Integrated on Silicon, ECS Transactions, vol. 33, No. 6, 2010, pp. 101-108.

Saraswat et al., High performance germanium MOSFETs, Materials Science and Engineering B, vol. 135, 2006, pp. 242-249.

Toriumi et al., Material Potential and Scalability Challenges of Germanium CMOS, 2011 IEEE International Electron Devices Meeting (IEDM), Washington, DC , Dec. 5, 2011, pp. 28.4.1-28.4.4.

Y. Kamata, High-k/Ge MOSFETs for future nanoelectronics, materials today, vol. 11, No. 1-2, Jan. 2008, pp. 30-38.

Brunco et al., Germanium MOSFET Devices: Advances in Materials Understanding, Process Development, and Electrical Performance, Journal of the Electrochemical Society, vol. 155, No. 7, May 23, 2008, pp. H552-H561.

Chui et al., A Sub-400° C. Germanium MOSFET Technology with High-K Dielectric and Metal Gate, International Electron Devices Meeting, 2002. IEDM '02, San Francisco, CA, Dec. 8, 2002, pp. 437-440.

Klekachev et al., Graphene Transistors and Photodetectors, The Electrochemical Society Interface, vol. 22, No. 1, Spring 2013, pp. 63-68.

Bodlaki et al., Ambient stability of chemically passivated germanium interfaces, Surface Science, vol. 543, 2003, pp. 63-74.

Bortug et al., Strained-Germanium Nanostructures for Infrared Photonics, ACS Nano, vol. 8, No. 4, Mar. 5, 2014, pp. 3136-3151.

Cooper et al., Experimental Review of Graphene, International Scholarly Research Network Condensed Matter Physics, vol. 2012, article ID 501686, 2012, pp. 1-56.

Online Disclosure for P130002US01, Available online prior to Mar. 21, 2014.

Li et al., Synthesis, Characterization, and Properties of Large-Area Graphene Films, ECS Transactions, vol. 19, No. 5, 2009, pp. 41-52.

Brey, L., et al., "Electronic states of graphene nanoribbons studied with the Dirac equation," *Physical Review* (Jun. 15, 2006), vol. 73, 235411, 5 pp. See, abstract and figure 1.

Chung, H.C., et al., "Exploration of edge-dependent optical selection rules for graphene nanoribbons," *Optic Express* (Nov. 1, 2011) (Online), vol. 19, pp. 23351-23363. See, abstract and figure 1.

International Search Report & Written Opinion issued on Oct. 30, 2015, for Intl. Patent Appl. No. PCT/US2015/049325, 11 pp.

Biro et al., Nanopatterning of graphene with crystallographic orientation control, Carbon, vol. 48, Apr. 14, 2010, pp. 2677-2689.

Nemes-lncze et al., Graphene nanoribbons with zigzag and armchair edges prepared by scanning tunneling microscope lithography on gold substrates microscope lithography on gold substrates, Applied Surface Science, vol. 291, Nov. 13, 2013, pp. 48-52.

Wang et al., Etching and Narrowing of Graphene from the Edges, Nature Chemistry, vol. 2, Jun. 27, 2010, pp. 661-665.

Non-Final Office Action for U.S. Appl. No. 14/222,163, mailed on Jun. 29, 2015, 23 pp.

Murdock et al., Controlling the Orientation, Edge Geometry, and Thickness of Chemical Vapor Deposition Graphene, ACS Nano, vol. 7, No. 2 , Jan. 24, 2013, pp. 1351-1359.

Wu et al., Growth of Single Crystal Graphene Arrays by Locally Controlling Nucleation on Polycrystalline Cu Using Chemical Vapor Deposition, Adv. Mater., 23, Sep. 23, 2011, pp. 4898-4903.

Yu et al., Control and characterization of individual grains and grain boundaries in graphene grown by chemical vapour deposition, Nature Materials, vol. 10, May 8, 2011, pp. 443-449.

Jacobberger et al., Direct oriented growth of armchair graphene nanoribbons on germanium, Nature Communications | 6:8006, Aug. 10, 2015, pp. 1-8.

SEED-MEDIATED GROWTH OF PATTERNED GRAPHENE NANORIBBON ARRAYS

REFERENCE TO GOVERNMENT RIGHTS

This invention was made with government support under SC0006414 awarded by the US Department of Energy. The government has certain rights in the invention.

BACKGROUND

Graphene is a two-dimensional carbon allotrope, the electronic, optical, and magnetic properties of which can be tuned by engineering two-dimensional graphene sheets into one-dimensional structures with confined widths, known as graphene nanoribbons. The properties of graphene nanoribbons are highly dependent on their width and edge structure.

It has been proposed that graphene nanoribbons will outperform conventional materials and lead to next-generation technologies. Graphene nanoribbons have already shown tremendous promise for providing enhanced performance in nanoelectronics, spintronics, optoelectronics, plasmonic waveguiding, photodetection, solar energy conversion, molecular sensing, and catalysis. However, the full potential of graphene nanoribbons in such applications has not been realized.

A major challenge facing graphene nanoribbon-based devices is that scalable approaches to create high-quality graphene nanoribbons with atomically-smooth edges are lacking. Conventional, top-down techniques in which graphene nanoribbons are etched from continuous graphene sheets result in structures with rough, disordered edges that are riddled with defects, which significantly degrade graphene's exceptional properties. This blunt top-down etching can be avoided by synthesizing nanoribbons from the bottom-up. For instance, organic synthesis can yield ribbons with smooth edges, defined widths, and complex architectures. However, organic synthesis forms short nanoribbons (typically ~20 nm in length) and is not adapted to technologically relevant substrates, such as insulators or semiconductors, limiting its potential for commercial development.

SUMMARY

Graphene nanoribbon arrays, methods of growing graphene nanoribbon arrays, and electronic and photonic devices incorporating the graphene nanoribbon arrays are provided.

One embodiment of a graphene nanoribbon array comprises a semiconductor substrate having a (001) facet and a plurality of graphene nanoribbons on the (001) facet of the semiconductor substrate. In the array, the graphene nanoribbons have aspect ratios of at least 4. Further, the graphene nanoribbons have the armchair crystallographic direction of graphene running all the way along their long axes and an armchair configuration along their edges. At least 60 percent of the graphene nanoribbons have their long axis oriented along a single [110] direction of the semiconductor substrate.

Another embodiment of a graphene nanoribbon array comprises a semiconductor substrate having a (001) facet and a plurality of graphene nanoribbons on the (001) facet of the semiconductor substrate, each of the graphene nanoribbons comprising an amorphous carbon seed along its length. In the array, the graphene nanoribbons have aspect ratios of at least 4. Further, the graphene nanoribbons have the armchair crystallographic direction of graphene running all the way along their long axes with an armchair configuration along their edges and have their long axes oriented along a [110] direction of the semiconductor substrate.

One embodiment of a method of growing graphene nanoribbons comprises: forming an array of graphene seeds on the (001) facet of a semiconductor substrate, wherein a majority of the graphene seeds have a single crystallographic orientation; and growing graphene nanoribbons from the graphene seeds via chemical vapor deposition from a mixture of methane gas and hydrogen gas, wherein the partial pressures of the methane and hydrogen are selected to result in the growth of graphene nanoribbons having their long axes oriented along a [110] direction of the semiconductor substrate and their armchair edges running parallel with the [110] direction of the semiconductor substrate.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Figure 1A:
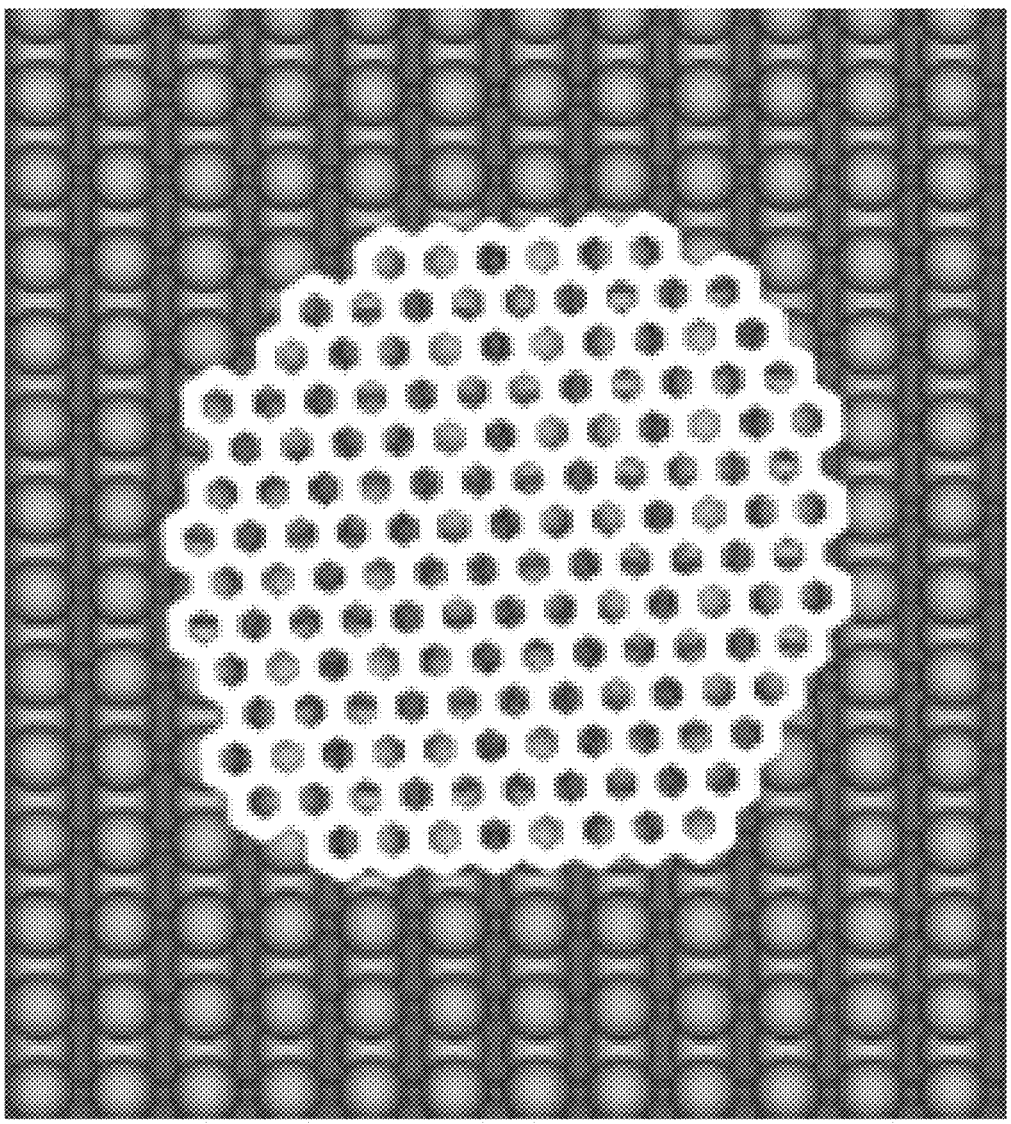
FIG. 1A. Schematic illustration of a graphene seed particle on the (001) facet of a substrate.

Graphene nanoribbon arrays, methods of growing graphene nanoribbon arrays and electronic and photonic devices incorporating the graphene nanoribbon arrays are provided. The graphene nanoribbons in the arrays are narrow, elongated strips (or "ribbons") of monolayer graphene having widths and crystallographic edge structures that provide the ribbons with electronic properties, such as electronic bandgaps, that are absent in continuous two-dimensional films of graphene. The graphene nanoribbons in the arrays are formed using a scalable, bottom-up, chemical vapor deposition (CVD) technique to grow oriented graphene nanoribbons with atomically-smooth edges from seed particles ("seeds") on the (001) facet of a semiconductor substrate. Because the graphene seeds comprise the same material as the graphene nanoribbons grown therefrom, they can be distinguished from heterogeneous nucleation sites that are provided by other types of materials, such as metals or metal oxides. Without intending to be bound to any particular theory of the invention, it is proposed that by using monolayer graphene seeds having a single crystallographic orientation and their armchair direction (that is, the direction of their lattice that is parallel with the C—C bonds) aligned along a single [110] direction of the (001) facet, the methods are able to produce high density graphene nanoribbon arrays in which the graphene nanoribbons are preferentially aligned along a single [110] direction on the substrate. In the methods, no terraces or other topographical features of the growth substrate are used to template the growth of the nanoribbons.

The graphene seeds can be patterned from a continuous monolayer graphene sheet. The graphene sheet can be grown on a sheet-growth substrate and then transferred onto the semiconductor substrate for patterning and nanoribbon growth. The sheet-growth substrate comprises a material on which the graphene is grown preferentially in a single crystallographic orientation. By grown preferentially, it is meant that most of the graphene in the monolayer is grown with a single crystallographic orientation. However, it should be recognized that there may be imperfections in the sheet-growth substrate that result in a minority of the graphene domains being grown with a different crystallographic orientation. Thus, it is advantageous to use a high-quality sheet-growth surface having a single in-plane orientation. Cu (111) is an example of a sheet-growth substrate material that is suitable for orientation-controlled graphene growth. Other suitable materials for the sheet-growth substrate include Ru (0001), Ni (111), Pd (111), Ir (111), Ge(110), and SiC (0001). Methods for the orientation-controlled CVD growth of graphene on Cu(111) are illustrated in the Example.

The monolayer graphene sheet is then released from its sheet-growth substrate and transferred onto the (001) facet of a semiconductor substrate. Germanium (Ge) is an example of a semiconductor having a (001) facet. Other examples include Group III-V semiconductors, such as GaAs and InAs. The transfer process may involve transferring the monolayer graphene sheet onto a temporary host substrate, followed by a transfer from the host substrate to the semiconductor substrate and the removal of any residual host substrate material. Both wet and dry thin film transfer techniques can be used. Both techniques are illustrated in the Examples which describe the dry transfer of graphene using a poly(methyl methacrylate) (PMMA)/gold (Au) bilayer host substrate and the wet transfer of graphene using a PMMA host substrate.

One or more seeds can then be patterned into the transferred graphene sheet. Typically, an array comprising a plurality of seeds will be patterned into the graphene sheets. For example, the arrays of seeds can comprise at least 10, at least 100, at least 1,000, or at least 10,000 seeds. High resolution lithographic techniques, such as electron beam lithography or extreme ultraviolet lithography, can be used to carry out the patterning. Because the graphene in the monolayer graphene sheet had a preferred crystallographic orientation, the seeds patterned from it will also have that same preferred crystallographic orientation. Again, however, a minority of the seeds may have a different orientation stemming from, for example, imperfections in the original sheet-growth substrate or imperfections introduced during the transfer process. The graphene transfer and subsequent patterning are carried out such that the armchair direction of the seeds is preferentially aligned along a single [110] direction of the (001) facet. As a result, anisotropic CVD growth of graphene nanoribbons from the seeds will be preferentially directed along that same [110] direction.

CVD is an inexpensive scalable technique, offering high throughput and compatibility with planar processing. The graphene nanoribbons are grown directly from the seeds on the (001) facet of a semiconductor platform using hydrocarbon precursor molecules, such as methane. The semiconductor platform can be purchased as a single-crystal wafer or can be epitaxially grown. Single-crystal semiconductor materials are available in large formats and are prevalent in the semiconductor industry. During the CVD growth, the growth conditions are selected to provide a graphene growth rate that is highly anisotropic, resulting in faceted graphene nanoribbons with high aspect ratios. During nanoribbon growth, the (001) facet of the semiconductor substrate is used to orient the long edges of the graphene nanoribbons, as well as the armchair direction of the graphene lattice within the ribbons, along the [110] directions of the semiconductor substrate. In addition, by orienting the graphene seed particles preferentially along a single [110] direction on the (001) facet, as discussed above and illustrated in the Examples, the growth of the graphene nanoribbons can be directed preferentially along that same [110] direction, with exclusively or almost exclusively armchair configurations along their edges. Although there may be a minute portion of zigzag segments near defects or kinks at the nanoribbon edges. FIG. 1A is a schematic illustration of a graphene seed particle on the (001) facet of a substrate. The anisotropic, seed-mediated growth of directionally aligned graphene nanoribbons from a graphene seed is illustrated schematically in FIG. 1B. Conditions and reactants suitable for achieving anisotropic growth of graphene nanoribbons on the (001) facet of a semiconductor substrate are illustrated in U.S. Pat. No. 9,324,804 and in Jacobberger et al., Nature Comm., DOI: 10.1038/ncomms9006, the entire disclosures of which are incorporated herein by reference.

The width of the nanoribbons corresponds closely to the width of the seed particles, with wider seeds producing wider nanoribbons. Although, the nanoribbons may be slightly wider than their seeds by the end of the nanoribbon growth process. Thus, lithographic patterning of the seed particles makes it possible to control the positions, density, inter-nanoribbon spacing, and the widths of the nanoribbons grown from the seeds. In addition, the size of the seed particles produced via lithographic patterning can be further reduced by annealing the seed particles in an atmosphere comprising a mixture of argon and hydrogen. Thus, the size of the seed particles and, therefore, the width of the nanoribbons grown therefrom can be further controlled by controlling the annealing conditions (e.g., temperature, time, and hydrogen concentration).

Figure 1B:
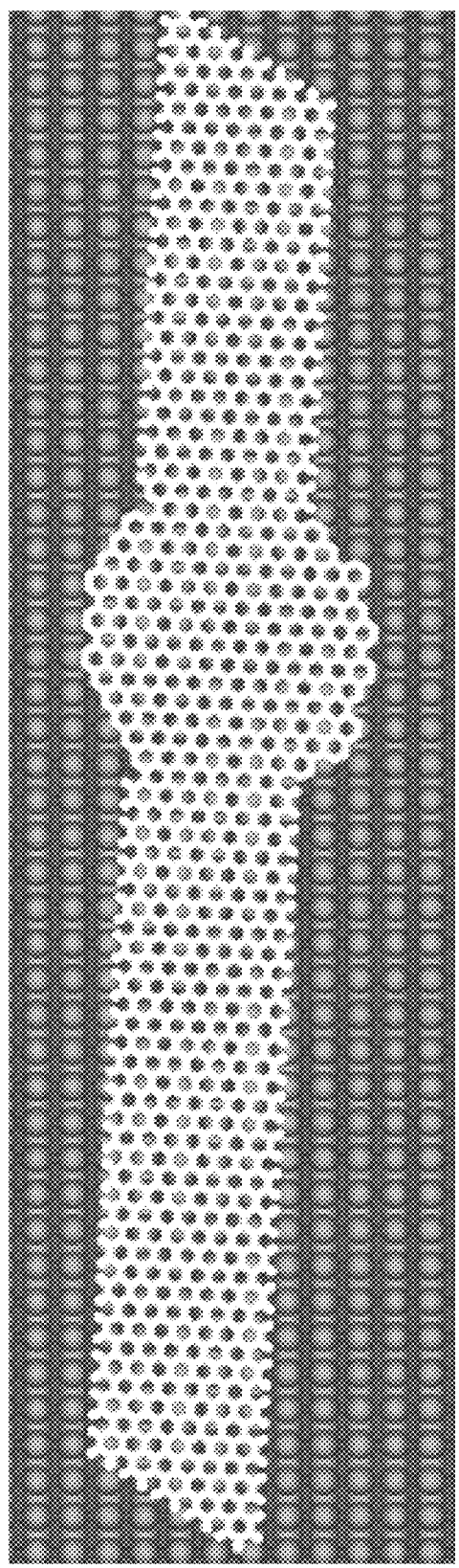
FIG. 1B. Schematic illustration of a graphene nanoribbon growing anisotropically from a graphene seed particle on the (001) facet of a substrate. The armchair configuration along the edges of the graphene nanoribbon is shown, as is the orientation of the long axis of the graphene nanoribbon along a [110] direction of the substrate.
Figure 2:
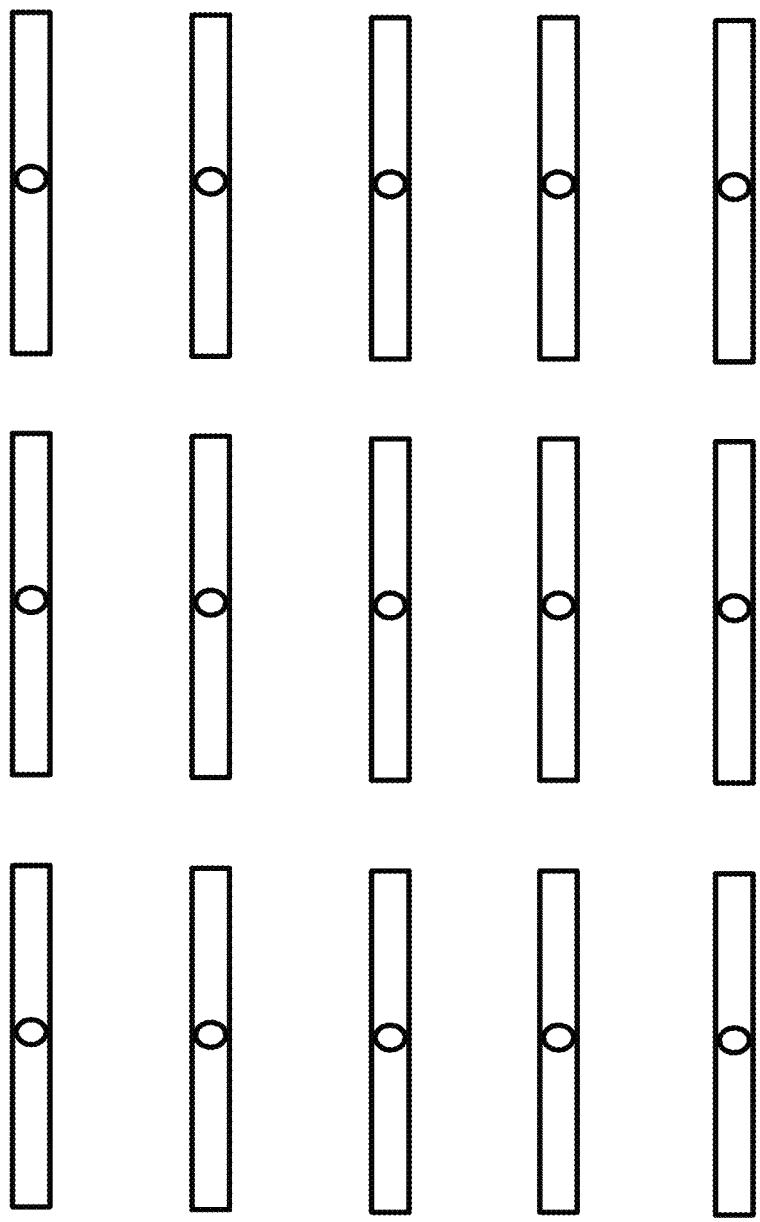
FIG. 2. Schematic illustration of a regular rectangular pattern of graphene nanoribbons on a substrate. The circles represent graphene seed particles and the rectangles represent the graphene nanoribbons.

In some embodiments, the seeds are disposed at random (i.e., non-pre-selected) locations on the surface of the substrate and, therefore, the nanoribbons grown from the seeds form arbitrary designs on the substrate. However, in other embodiments the seeds are patterned into a regular pattern, such that nanoribbons grown from the directionally aligned graphene seeds are laid out on the substrate in a regular pattern. For the purposes of this disclosure a "regular pattern of graphene nanoribbons" is one in which the end-to-end spacing between the nanoribbons and/or the lateral (i.e., edge-to-edge) spacing between the nanoribbons is equal and/or periodically repetitious. (Spacings can be considered equal if they deviate from perfectly equal and the difference is due to limitations in the tolerances of the equipment used to form them.) For example, the schematic diagram in FIG. 2 shows a plurality of graphene nanoribbons laid out in a rectangular array in which the end-to-end and edge-to-edge distances between the nanoribbons are equal. In that figure, the circles represent graphene seeds, as shown in FIG. 1A and the rectangles represent graphene nanoribbons, as shown in FIG. 1B. In some embodiments, the average width of the seeds in the plurality of seeds and the average width of the nanoribbons in the plurality of nanoribbons is no greater than 20 nm. This includes embodiments in which the average width of the seeds in the plurality of seeds and the average width of the nanoribbons in the plurality of nanoribbons is no greater than 10 nm and further includes embodiments in which the average width of the seeds in the plurality of seeds and the average width of the nanoribbons in the plurality of nanoribbons is no greater than 5 nm. In some embodiments of the nanoribbon arrays, the nanoribbons that are aligned along a single [110] direction of the (001) facet have a lateral and/or end-to-end spacing with respect to their nearest neighbors (i.e., an inter-nanoribbon spacing) of no greater than 20 nm. This includes embodiments of the nanoribbon arrays in which the nanoribbons that are aligned along a single [110] direction of the (001) facet have a lateral and/or end-to-end spacing with respect to their nearest neighbors of no greater than 10 nm and further includes embodiments of the nanoribbon arrays in which the nanoribbons that are aligned along a single [110] direction of the (001) facet have a lateral and/or end-to-end spacing with respect to their nearest neighbors of no greater than 5 nm. However, larger lateral and/or end-to-end spacings are also possible, including spacings greater than 20 nm, greater than 50 nm, and greater than 100 nm.

The present disclosure is not limited to arrays of graphene nanoribbons in which all of the nanoribbons are aligned along a single [110] direction of the (001) of a substrate. Factors such as the quality of the sheet-growth substrate, the transfer process, and the accuracy of the seed patterning can result in a minority of the nanoribbons being grown at right angles from the selected, predominant [110] direction. However, the level of alignment provided by the present graphene nanoribbon arrays, even using imperfect procedures and substrates, makes them readily distinguishable from arrays of nanoribbons that are randomly aligned along the two equivalent [110] directions of a (001) facet. In a randomly aligned nanoribbon array, 50% of the graphene nanoribbons would be aligned along the first of the two equivalent [110] directions and 50% along the second of the two equivalent [110] directions. In the present graphene nanoribbon arrays, a majority of the graphene nanoribbons are aligned along the same [110] direction. For example, in some embodiments of the graphene nanoribbon arrays, at least 60% of the graphene nanoribbons are aligned along the same [110] direction of the (001) facet of the semiconductor substrate. This includes embodiments in which at least 70% of the graphene nanoribbons are aligned along the same [110] direction of the (001) facet of the semiconductor substrate, further includes embodiments in which at least 80% of the graphene nanoribbons are aligned along the same [110] direction of the (001) facet of the semiconductor substrate, and still further includes embodiments in which at least 90% of the graphene nanoribbons are aligned along the same [110] direction of the (001) facet of the semiconductor substrate. The percentage of alignment for a given distribution of graphene nanoribbons can be determined by analyzing SEM images of the graphene nanoribbons and counting the number of graphene nanoribbons that are in alignment.

For graphene nanoribbon arrays in which less than 100% nanoribbon alignment is achieved over the entire (001) facet, there may be local areas on the (001) facet in which the graphene nanoribbons have perfect (100%) or near perfect (e.g., >95%) alignment along a single [110] direction. For example, even for arrays in which only about 60% of the nanoribbons are aligned along the same [110] direction, there may be portions of the array having a surface area of, for example, at least 4 $\mu m^2$, in which at least 90%, at least 95%, at least 99%, or even 100% of the nanoribbons are aligned along the same [110] direction.

For the purposes of this disclosure, the long axis of a graphene nanoribbon does not have to be perfectly aligned with (i.e., have a 0° rotation with respect to) a [110] direction of the semiconductor substrate surface in order to be considered aligned along that direction. Small rotational deviations may stem from, for example, an initial rotation in the growth direction that becomes energetically unfavorable as the nanoribbons grow. Thus, at a minimum, a graphene nanoribbon is considered to be aligned along a [110] direction if its long axis is rotated with respect to that directed by a smaller degree than it is with respect to the other [110] direction. For example, a graphene nanoribbon may be considered to be aligned along (or aligned with) a [110] direction if its long axis is rotated by no more than ±15° from the [110] direction of the semiconductor surface. This includes graphene nanoribbon arrays in which nanoribbons that are rotated by no more than ±5° from the [110] direction of the semiconductor surface are considered to be aligned along (or aligned with) a [110] direction, further includes graphene nanoribbon arrays in which nanoribbons that are rotated by no more than ±3° from the [110] direction of the semiconductor surface are considered to be aligned along (or aligned with) a [110] direction, and still further includes graphene nanoribbon arrays in which nanoribbons that are rotated by no more than ±0° from the [110] direction of the semiconductor surface are considered to be aligned along (or aligned with) a [110] direction.

Figure 3:
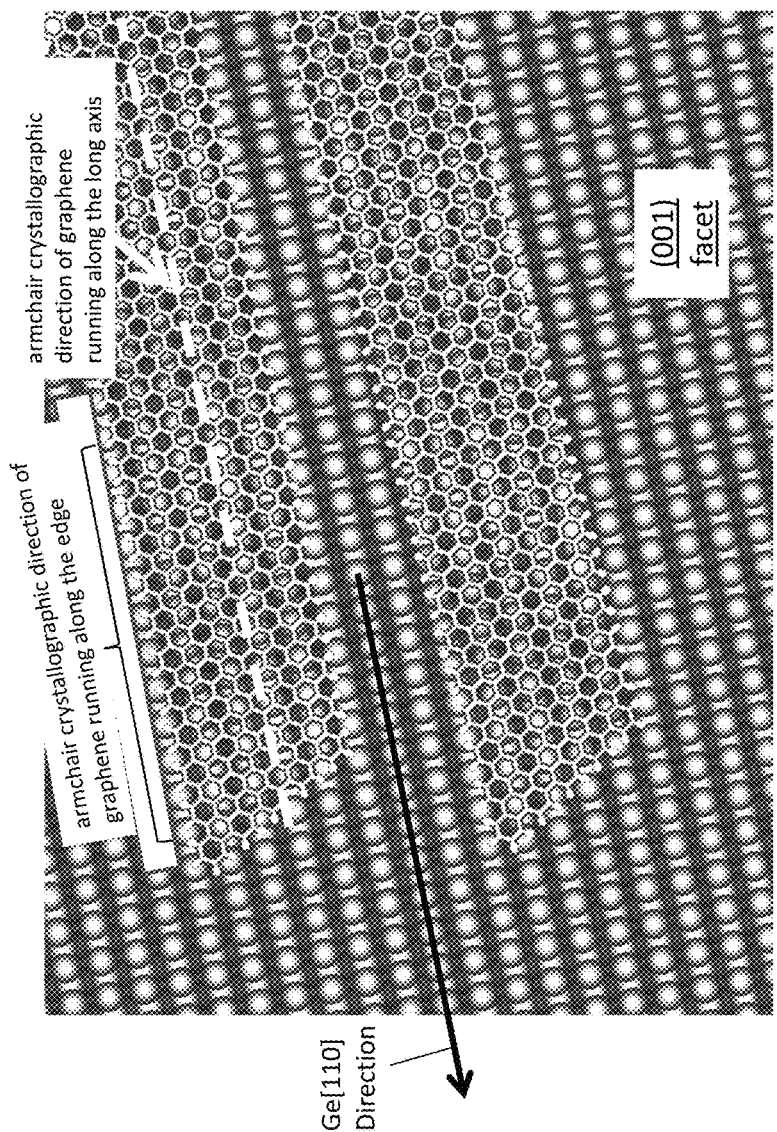
FIG. 3. Schematic illustration of a graphene nanoribbon with armchair edges perfectly aligned along the Ge [110] direction (upper nanoribbon) and a graphene nanoribbon with armchair edges aligned within about ±3° of the Ge [110] direction (lower nanoribbon).

This is illustrated schematically in FIG. 3 for graphene nanoribbons on the (001) facet of a germanium substrate in which one nanoribbon has a perfect alignment and the other is rotated by about 3°. In that figure, the lighter grey circles represent the top two layers of germanium in the substrate, while the darker grey circles, which are only partially visible under the top two layers, represent germanium atoms in lower layers of the substrate. The arrow represents the Ge [110] direction. The upper graphene nanoribbon is perfectly aligned along the Ge [110] direction. In the lower graphene nanoribbon, the armchair crystallographic direction of graphene and the long axis of the ribbons deviate by about 3° from perfect alignment.

Because the graphene nanoribbons are grown via seed-mediated bottom-up growth, rather than patterned lithographically from graphene sheets, they are formed with nearly atomically smooth edges. The degree of edge smoothness can be characterized by the average root mean square (rms) roughness of the edges of the nanoribbons in the array. The rms edge roughness along the length of a nanoribbon can be measured using scanning tunneling microscopy (STM). Methods of using STM to determine the rms edge roughness of a graphene nanoribbon can be found in U.S. Pat. No. 9,287,359. The average rms edge roughness for the nanoribbons in a nanoribbon array will vary since longer nanoribbons within the array will tend to have rougher edges. For the purposes of this disclosure, a nanoribbon is considered to have an atomically smooth edge if its edge has an rms roughness of less than 1 nm over a length of at least 40 nm. Some embodiments of the present nanoribbon growth methods form nanoribbons having an rms roughness of less than 0.5 nm over an edge length of at least 40 nm. This includes embodiments of the growth methods that form nanoribbons that have perfectly atomically smooth edges, that is—having an rms roughness of 0 nm, over an edge length of at least 10 nm.

Short nanoribbons having atomically smooth edges, including those with perfectly atomically smooth edges, are well-suited for use as channel materials in FETs having channel lengths of 40 nm or less, including those having channel lengths of 10 nm or less. Therefore, short nanoribbons having atomically smooth edges can be identified within the nanoribbon arrays and selectively incorporated into an FET. Alternatively, short nanoribbon segments having atomically smooth edges can be cut from longer nanoribbons and selectively incorporated into an FET.

The use of the (001) facet as a growth surface and the conditions for depositing graphene via CVD from a hydrocarbon precursor described herein are selected to provide graphene nanoribbon growth. As a result, the present methods are distinguishable from methods in which CVD is used to grow graphene sheets on a substrate via island growth. In order to distinguish the present graphene nanoribbons from other graphene structures that have been grown via CVD, graphene nanoribbons are defined, for the purposes of this disclosure, as graphene structures having aspect ratios of at least 4 and having at least two edges that run substantially parallel with each other, where the aspect ratio is the ratio of the length of the nanoribbon to its width. In addition, the present graphene nanoribbons, as grown on the semiconductor substrate, are characterized by the armchair crystallographic direction of graphene running substantially parallel to the long nanoribbon axis, which is oriented along a [110] direction of the surface. The phrase 'substantially parallel' is used in recognition of the fact that the edges may be parallel on a global scale, but might include edge portions that deviate slightly from perfectly parallel on an atomic scale due to edge roughness.

As illustrated in the Examples below, the graphene nanoribbons can be deposited from a mixture of methane gas and hydrogen gas. By varying the composition of the precursor gas mixture during growth, the duration of the growth time, the growth temperature, and the size and crystallographic orientation of the seeds, the graphene nanoribbon width, length, and aspect ratio can be controlled. This control over the nanoribbon structure makes it possible to tune the graphene properties. For example, graphene undergoes a metallic-to-semiconducting transition as the nanoribbon width decreases, wherein the induced bandgap is inversely proportional to the nanoribbon width. Therefore, the present approach makes it possible to control the width of the nanoribbons and, therefore, to tailor their electronic structure. By tuning the seed size, precursor composition, and growth time, nanoribbons with widths below 10 nm can be grown.

Key parameters for realizing anisotropic growth are the mole fractions of the precursor molecules and the carrier molecules used in the CVD gas mixture, where the mole fractions can be adjusted by adjusting the partial pressures of the precursor and carrier gases. However, these parameters are not independent, so the optimal value for one of the parameters will depend on the others. By way of illustration only, seed-mediated anisotropic growth of nanoribbons from a mixture of $H_2$ and $CH_4$ can be achieved at certain combinations of temperatures in the range from about 860 to 935° C., $H_2$ mole fractions in the range from about $5.0 \times 10^{-3}$ to 0.33 and $CH_4$ mole fractions in the range from about $3.0 \times 10^{-5}$ to $2.0 \times 10^{-2}$. Guidance for selecting an appropriate combination of temperatures and mole fractions (partial pressures) is provided in the Examples, below. In general, nanoribbon growth is favored by a high $H_2$ mole fraction and low $CH_4$ mole fraction, which corresponds to a slow growth rate. For example, in some embodiments of the growth methods, the growth conditions are selected to provide growth rates of no greater than 500 nm/hr. This includes embodiments in which the growth conditions are selected to provide growth rates of no greater than 300 nm/hr, further includes embodiments in which the growth conditions are selected to provide growth rates of no greater than 100 nm/hr and still further includes embodiments in which the growth conditions are selected to provide growth rates of no greater than 35 nm/hr. These growth rates refer to the growth rate of the fastest growing edge dimension of the graphene crystal structures.

In addition to the seed size and seed annealing conditions (discussed above), the growth time plays a role in determining the dimensions of the CVD-grown graphene nanoribbons. Generally, as growth time is decreased, narrower, shorter nanoribbons are formed. Therefore, by tuning the duration of the growth time and the ratio of precursor gas to carrier gas in the gas mixture, nanoribbons with desired lengths and widths can be selectively grown using bottom-up CVD growth.

The optimal conditions for achieving anisotropic graphene growth may vary somewhat depending upon the laboratory conditions. For example, in a cleaner environment, the growth rate at a given set of conditions would be expected to be slower than in a dirtier environment. Therefore, to achieve the same low growth rate observed under standard laboratory conditions in a cleaner system, such as a clean room, a higher $CH_4$ mole fraction and/or a lower $H_2$ mole fraction could be used.

By way of illustration, in some embodiments of the graphene nanoribbon arrays, the average aspect ratio of the nanoribbons in the array is at least 5. This includes graphene nanoribbon arrays in which the average aspect ratio of the nanoribbons in the array is at least 10, further includes graphene nanoribbon arrays in which the average aspect ratio of the nanoribbons in the array is at least 20 and still further includes graphene nanoribbon arrays in which the average aspect ratio of the nanoribbons in the array is at least 30. Included in some embodiments of such arrays are graphene nanoribbons having aspect ratios of at least 30, at least 40, at least 50, at least 60 and/or at least 70.

The average width of the graphene nanoribbons in some of the graphene nanoribbon arrays is no greater than 60 nm. This includes graphene nanoribbon arrays in which the average width of the graphene nanoribbons is no greater than 40 nm and further includes graphene nanoribbon arrays in which the average width of the graphene nanoribbons is no greater than 20 nm. Included in some embodiments of such arrays are graphene nanoribbons having widths of no greater than 10 nm and/or widths of no greater than 5 nm.

The average length of the graphene nanoribbons in some of the graphene nanoribbon arrays is at least 20 nm. This includes graphene nanoribbon arrays in which the average length of the graphene nanoribbons is at least 50 nm, further includes graphene nanoribbon arrays in which the average length of the graphene nanoribbons is at least 100 nm, further includes graphene nanoribbon arrays in which the average length of the graphene nanoribbons is at least 200 nm, and further includes graphene nanoribbon arrays in which the average length of the graphene nanoribbons is at least 500 nm.

While graphene seed-mediated, CVD-based graphene nanoribbon growth methods can be used to grow graphene nanoribbons having their graphene crystal lattice oriented preferentially along one [110] direction of a (001) facet, without the need to use step edges or trenches to dictate the growth direction, they can also be used to grow graphene nanoribbons having their crystal lattice oriented non-preferentially along both of the two equivalent [110] directions of a (001) surface. Preferential orientation along one direction can be carried out by transferring a monolayer graphene sheet with a preferred crystal orientation onto the (001) facet of a semiconductor substrate, patterning an array of graphene seeds into the monolayer graphene sheets, and carrying out anisotropic CVD growth of graphene nanoribbons from the seeds, as described above. However, if preferential alignment of the nanoribbons is not required or desired, the graphene seeds need not be formed with a preferred crystallographic orientation with their crystal lattice aligned along a single [110] direction of the (001) facet. In the graphene nanoribbon arrays made under these conditions, the nanoribbon alignment will closely reflect the distribution of each crystal orientation in the graphene monolayer from which the seeds were formed.

Alternatively, for applications where it is not required or desired for the graphene nanoribbons to be preferentially aligned along a single [110] direction, amorphous carbon seeds can be used, rather than crystalline graphene seeds, for nucleating anisotropic CVD growth of nanoribbons on the (001) facet of a semiconductor substrate. Because the amorphous carbon seeds lack a lattice orientation capable of directing graphene nanoribbon growth along a single direction, graphene nanoribbon growth from the amorphous carbon seeds will be random and, therefore, evenly distributed along the two equivalent [110] directions and, in some cases, may grow in cross shapes on the substrate surface.

In addition, if amorphous carbon seeds are used, selective growth along a single [110] direction can be achieved by miscutting the growth surface of the semiconductor substrate toward a 110 direction, such that a series of parallel (001) faceted terraces, separated by steps that are a multiple of two atomic layers in height, are formed and the graphene nanoribbons are grown with a parallel alignment along the terraces. For example, the steps can be two, four, six, eight, ten, etc., atomic layers in height. The terraces can be formed using a miscut angle of, for example, about 9° or higher in order to provide steps that are two atomic layers high.

The present methods can produce graphene nanoribbon arrays having a high density of very narrow, smooth-edged, nanoribbons over a large area. Arrays of these atomically-smooth nanoribbons can include thousands of nanoribbons and can be formed over areas of, for example, at least 1 µm$^2$. This includes high density nanoribbon arrays that extend over areas of at least 100 µm$^2$, at least 1 mm$^2$, and at least 10 mm$^2$, the area of the nanoribbon arrays being limited only by the area of the surface of the substrate.

The graphene nanoribbon arrays can be incorporated into a variety of devices, including electronic and photonic devices, such as field effect transistors and photodetectors. One embodiment of a field effect transistor comprising a graphene nanoribbon array comprises: a source electrode; a drain electrode; a gate electrode; a conducting channel in electrical contact with the source electrode and the drain electrode; a gate dielectric disposed over the conducting channel, but below the gate electrode; and a semiconductor substrate having a (001) facet. In the transistor, the conducting channel comprises a plurality of directionally aligned graphene nanoribbons on the (001) facet of the semiconductor substrate, wherein the long nanoribbon axis is oriented along a [110] direction of the semiconductor surface and the nanoribbons have the armchair crystallographic direction of graphene running parallel to the long edges of the nanoribbons.

Alternatively, once the graphene nanoribbon arrays are formed on the semiconductor substrates, they can be transferred to other substrates, such as silicon substrates, polymer (e.g., plastic) substrates, dielectric substrates or metal substrates. Methods for transferring graphene from a germanium substrate to another substrate are described in Wang et al., *Scientific Reports* 3, Article number: 2465. The transfer procedure described in the Examples that follow illustrates a modified version of the methods described in Wang et al. The transferred graphene nanoribbons and the substrate onto which they are transferred can then be incorporated into a variety of devices.

EXAMPLES

Example 1: Graphene Seed-Mediated CVD Growth of Preferentially Aligned Graphene Nanoribbons on Germanium (001)

Materials and Methods:
Monolayer Graphene Synthesis on Cu (111):
A copper (Cu) thin film was deposited onto a sapphire (0001) substrate (MTI Corp.) using a CVC 601 DC magnetron sputterer operating at 1 kW with 5 mtorr of argon (Ar) backfill. Graphene growth was performed in a horizontal hot-walled chemical vapor deposition (CVD) system with a quartz tube having an inner diameter of 34 mm. The Cu/sapphire sample was loaded into the system and the system was then filled to atmospheric pressure with a mixture of Ar (purity of 99.999%) and hydrogen (H$_2$) (purity of 99.999%) with a flow rate of 345 sccm and 18 sccm, respectively. The Cu/sapphire sample was annealed for 4 minutes at 1000° C. and then 87 ppm of methane (CH$_4$) (purity of 99.99%) was introduced to begin the graphene synthesis. Growth occurred for 1.5 hours before the sample was rapidly cooled to terminate synthesis, at which point a continuous monolayer of graphene was coated onto the Cu (111) thin films.

Dry Transfer of Graphene onto Germanium:
The first method used to transfer the monolayer graphene from the Cu growth substrate onto Ge was a dry transfer. In this process, a 60 nm layer of gold (Au) was thermally evaporated on the graphene/Cu/sapphire substrate. A solution of 4% 950 kg/mol PMMA in anisole was spin coated on the Au/graphene/Cu/sapphire structure at 3000 rpm for 1 minute. The sample was then baked on a hot plate at 185° C. for 10 minutes. Thermal release tape (TRT) was adhered to the PMMA/Au/graphene/Cu/sapphire and then removed, separating the PMMA/Au/graphene from the Cu/sapphire substrate. This stack was immediately stamped onto Ge (001) and the TRT was subsequently released on a hot plate at 120° C., resulting in a PMMA/Au/graphene/Ge stack. The sample was baked on a hot plate at 185° C. for 10 minutes. The stack was then loaded into a horizontal tube furnace and the system was filled to atmospheric pressure with a mixture of 95% Ar (purity of 99.999%) and 5% $H_2$ (purity of 99.999%) with a total flow rate of 50 sccm. The sample was annealed for 1 hour at 400° C. to remove the PMMA. The Au/graphene/Ge was placed in potassium iodide (KI) for 20 minutes to etch the Au layer and then rinsed in a water ($H_2O$) bath at 90° C. for 20 minutes, resulting in a continuous monolayer of graphene on a Ge (001) wafer.

Wet Transfer of Graphene onto Germanium:

The second method used to transfer monolayer graphene from Cu onto Ge was a wet transfer. In this process, a solution of 4% 950 kg/mol PMMA in anisole was spin coated on the graphene/Cu/sapphire substrate at 2000 rpm for 1 minute. The PMMA/graphene/Cu/sapphire stack was submerged in 0.2 M iron (III) chloride ($FeCl_3$)/0.2 M hydrochloric acid (HCl) to etch the Cu layer. The resulting PMMA/graphene membrane was transferred to and floated on the surface of a water bath. Ge (001) was then used to lift the PMMA/graphene membrane out of the water bath. The PMMA/graphene/Ge was placed on a spin coater and rotated at 4000 rpm to spin dry. The PMMA/graphene/Ge stack was placed in acetone at 120° C. for 15 minutes to dissolve the PMMA and then washed with isopropyl alcohol (IPA), resulting in a continuous monolayer of graphene on a Ge (001) wafer.

Graphene Dot Array Production:

In order to pattern the continuous graphene film on Ge (001) into isolated seeds, a solution of 1% 950 kg/mol PMMA in chlorobenzene was spin coated at 4000 rpm for 1 minute. The sample was then placed on a hot plate at 185° C. for 1.5 minutes. Electron-beam lithography was used to define the graphene seed patterns. The patterns were developed in 1:3 methyl isobutyl ketone (MIBK)/IPA for 1 minute. Thermal evaporation was used to deposit 10 nm of aluminum (Al) onto the sample. The sample was then placed in acetone at 120° C. for 10 minutes before being sonicated for 10 minutes to remove Al/PMMA in regions that were not exposed to the electron beam during patterning. The Al mask/graphene/Ge stack was placed in a Unaxis 790 Reactive Ion Etcher for a 30 second $O_2$ plasma (50 W, 10 mtorr) etch to remove all graphene that was not covered by the Al mask. The Al was etched in phosphoric acid ($H_3PO_4$) for 30 minutes, leaving the patterned graphene seeds on Ge (001).

Graphene Nanoribbon Growth:

The graphene seed array on Ge (001) was loaded into a horizontal hot-walled CVD system with a quartz tube having an inner diameter of 34 mm. The system was evacuated to ~$10^{-6}$ torr and then filled to atmospheric pressure with a mixture of Ar (purity of 99.999%) and $H_2$ (purity of 99.999%) with a total flow rate of 300 sccm. The sample was annealed for 1 hour at 910° C. and then $CH_4$ (purity of 99.99%) was introduced to begin synthesis. Nanoribbons can be grown over a wide range of conditions, some of which are provided in Supplementary Table 1 of the article "Direct oriented growth of armchair graphene nanoribbons on germanium" in Jacobberger et al., Nature Comm., DOI: 10.1038/ncomms9006. For example graphene nanoribbons can be grown from the graphene seeds using 200 sccm Ar, 100 sccm $H_2$, and 2.0 sccm $CH_4$ at 910° C. for 2 hours. Growth was terminated by rapidly cooling the samples in the same atmosphere used during synthesis by sliding the furnace away from the growth region. During synthesis, graphene nucleation occurred preferentially at the lithographically-defined seeds, resulting in the formation of nanoribbons at these locations. If the graphene seeds have a single orientation (or predominantly a single orientation), as they do if graphene grown on Cu (111) is transferred to Ge (001), and if the seeds are aligned along a single in-plane Ge [110] direction (or predominantly a single in-plane Ge [110] direction), the long-axis of the nanoribbons preferentially aligns along that same direction, resulting in unidirectional (or predominantly unidirectional) arrays of graphene nanoribbons.

Characterization:

After growth, the samples are characterized using a Zeiss LEO 1530 Scanning Electron Microscope (SEM).

Figure 4A:
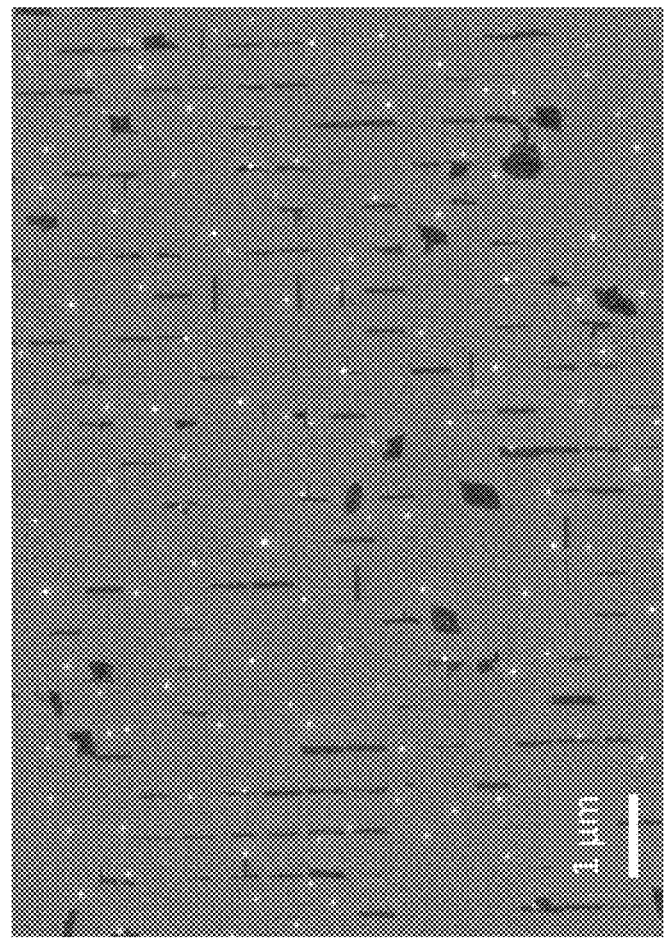
FIG. 4A. Scanning electron microscope image of a graphene nanoribbon array made by graphene seed-mediated chemical vapor deposition growth on a Ge (001) substrate and a dry transfer technique.
Figure 4B:
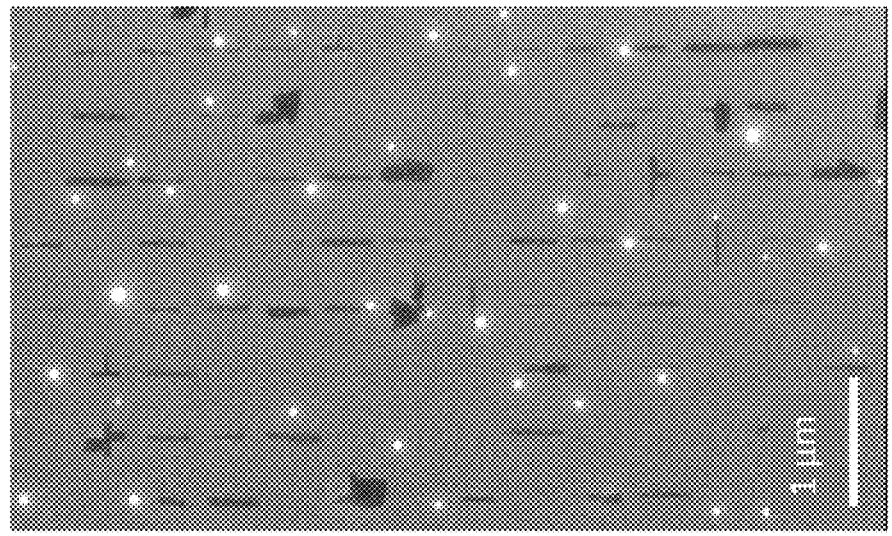
FIG. 4B. Scanning electron microscope image of another graphene nanoribbon array made by graphene seed-mediated chemical vapor deposition growth on a Ge (001) substrate and a dry transfer technique.

Results:

An SEM image of a graphene nanoribbon array on a Ge (001) substrate is shown in FIG. 4A. FIG. 4B is an SEM image of another graphene nanoribbon array made by graphene seed-mediated chemical vapor deposition growth on a Ge (001). These arrays were made by dry transferring the graphene. The seeds were annealed for 1 hour and then the nanoribbons were grown for 2 hours with growth conditions of 200 sccm Ar, 100 sccm $H_2$, and 2.0 sccm $CH_4$ at 910° C. In the sample of graphene nanoribbons in FIG. 4A, 73% are aligned along the vertical direction in the image. For the purposes of this example and the percentages of alignment recited herein, graphene nanoribbons were considered aligned if they were rotated by no more than ±5° from the [110] direction of the semiconductor surface. The average length is 393±72 nm, the average width is 51.3±15.8 nm, and average aspect ratio is 7.6±3.4. In the sample of graphene nanoribbons in FIG. 4B, 82% are aligned along the vertical direction in the image. The average length is 319±75 nm, the average width is 35±19 nm, and the average aspect ratio is 11.3±7.6.

Figure 4C:
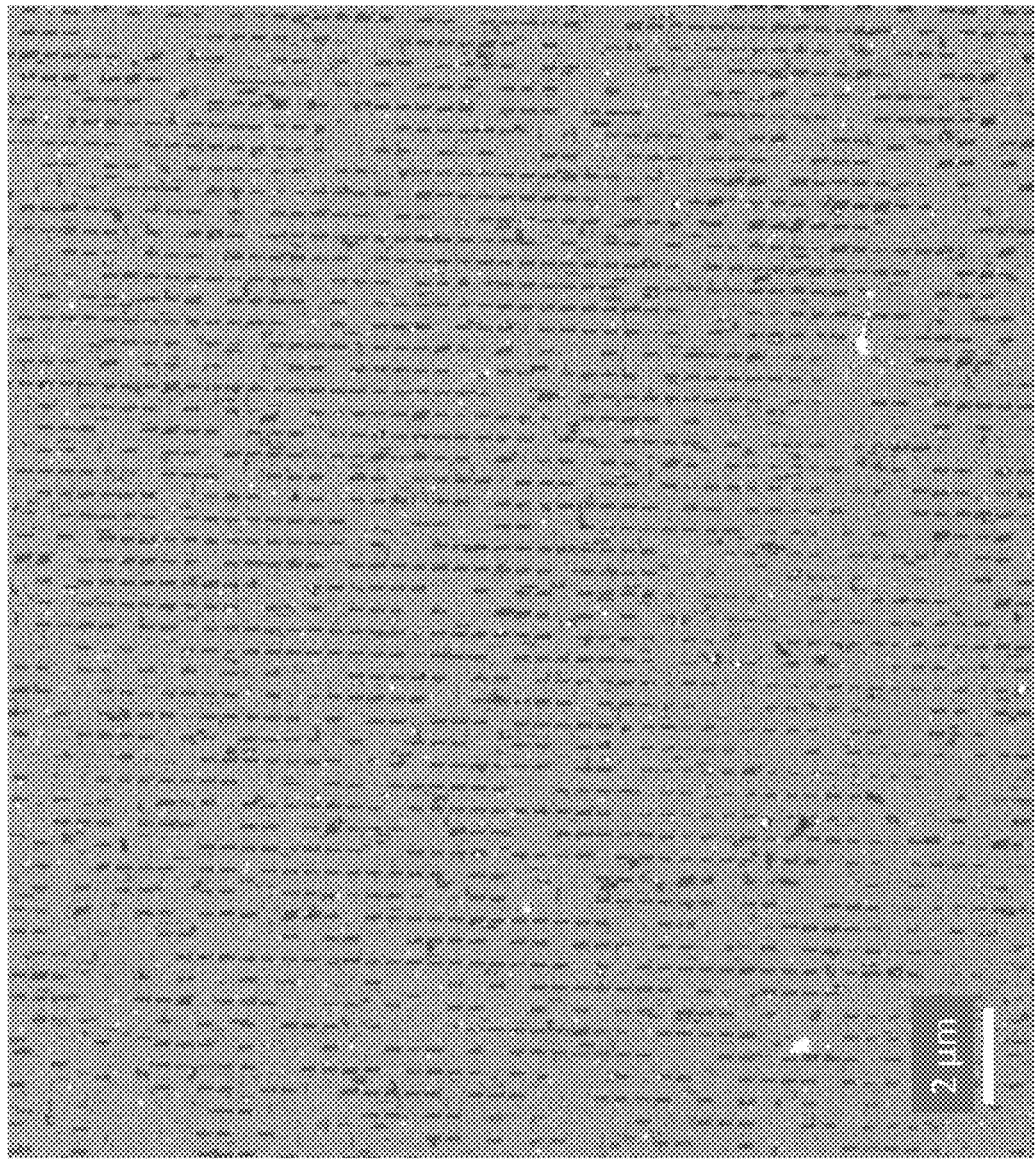
FIG. 4C. Scanning electron microscope image of a graphene nanoribbon array made by graphene seed-mediated chemical vapor deposition growth on a Ge (001) substrate and a wet transfer technique.
Figure 4D:
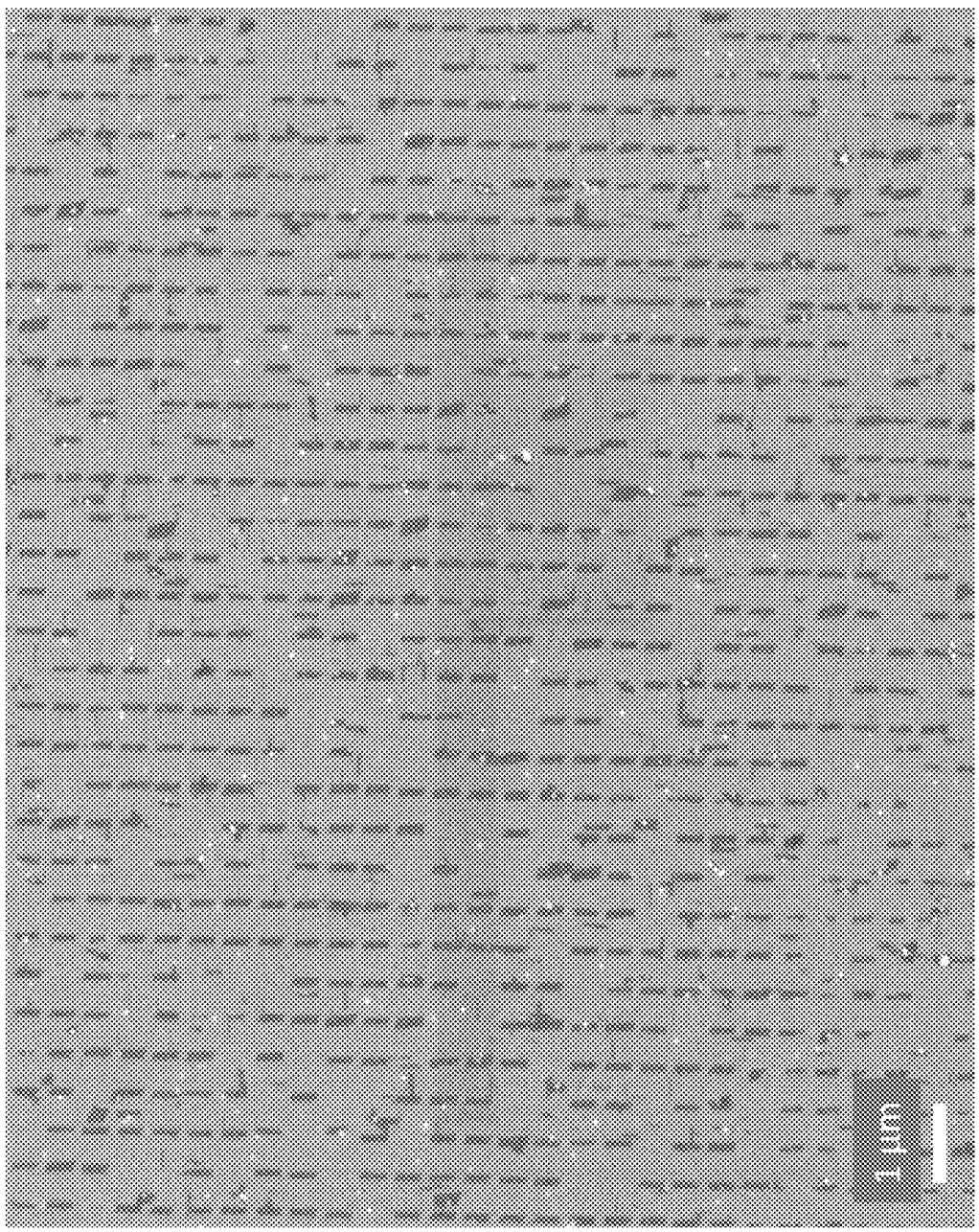
FIG. 4D. Enlarged view of a portion of the image of FIG. 4C.

An SEM image of another graphene nanoribbon array on a Ge (001) substrate is shown in FIG. 4C. An enlarged portion of the array is shown in FIG. 4D. This array was made by wet transferring the graphene. The seeds were annealed for 1 hour and then the nanoribbons were grown for 1.75 hours with growth conditions of 200 sccm Ar, 100 sccm $H_2$, and 2.0 sccm $CH_4$ at 910° C. In the sample of graphene nanoribbons in FIGS. 4C and 4D, 79% are aligned along the vertical direction in the image. The average length is 338±48 nm, the average width is 89.6±17.5 nm, and the average aspect ratio is 3.77±0.8.

Example 2: Amorphous Carbon-Mediated CVD Growth of Randomly Aligned Graphene Nanoribbons on Germanium (001)

a-C Array Production:

In order to pattern an array of amorphous carbon (a-C) seeds on Ge (001), a solution of 1% 950 kg/mol PMMA in chlorobenzene was spin coated onto a Ge (001) substrate at 4000 rpm for 1 minute. The sample was then baked on a hot plate at 185° C. for 1.5 minutes. Electron-beam lithography was used to define the seed patterns. The patterns were developed in 1:3 methyl isobutyl ketone (MIBK):IPA for 1 minute. A plasma sputterer was used to deposit 5 nm of carbon (C) onto the sample using a graphite source. The sample was then placed in acetone at 120° C. for 10 minutes before being sonicated for 10 minutes to remove a-C/PMMA in regions that were not exposed to the electron beam during patterning. This resulted in a patterned array of a-C seeds on Ge (001).

Graphene nanoribbon growth and characterization were carried out as described in Example 1.

Figure 5:
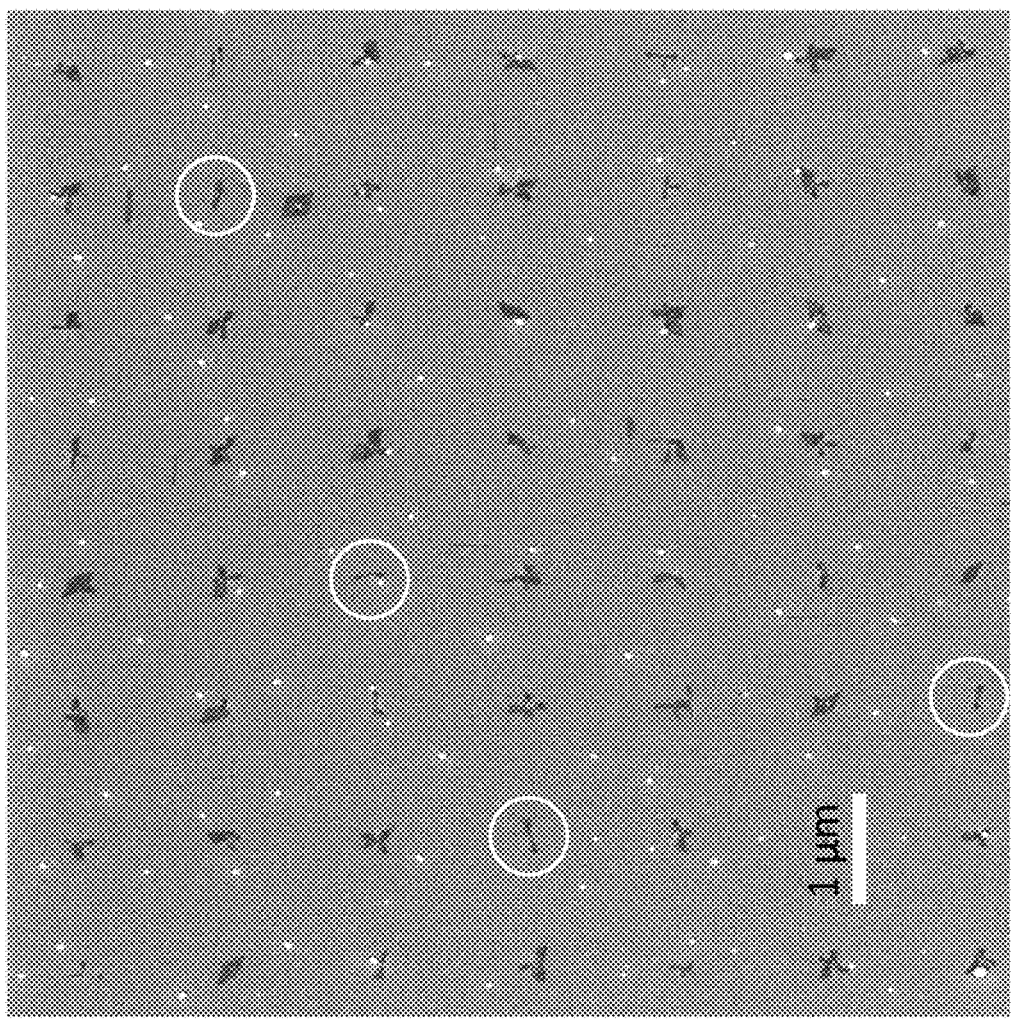
FIG. 5. Scanning electron microscope image of an array of graphene crystal structures, including graphene crosses and graphene nanoribbons, as well as other lower aspect ratio structures, made by amorphous carbon seed-mediated chemical vapor deposition growth on a Ge (001) substrate. Graphene nanoribbons having a vertical or horizontal orientation in the image are circled.

The array of graphene crystal structures is shown in the SEM image of FIG. 5. As shown in the image, the structures include graphene nanoribbons aligned along both [110] directions of the germanium (circled), as well as graphene crosses and crystal structures having low aspect ratios (e.g., graphene islands).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more".

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A graphene nanoribbon array comprising:
a semiconductor substrate having a (001) facet; and
a plurality of graphene nanoribbons on the (001) facet of the semiconductor substrate;
wherein the graphene nanoribbons have aspect ratios of at least 4; and
further wherein the graphene nanoribbons have an armchair crystallographic direction of graphene running all the way along their long axes and an armchair configuration along their edges, and further wherein at least 60 percent of the graphene nanoribbons have their long axis oriented along a single [110] direction of the semiconductor substrate.

2. The graphene nanoribbon array of claim 1, wherein at least 80 percent of the graphene nanoribbons have their long axis oriented along a single [110] direction of the semiconductor substrate.

3. The graphene nanoribbon array of claim 1, wherein the at least 60 percent of the graphene nanoribbons have their long axes rotated by no more than ±15° from the [110] direction of the semiconductor substrate.

4. The graphene nanoribbon array of claim 1, wherein the at least 80 percent of the graphene nanoribbons have their long axes rotated by no more than ±5° from the [110] direction of the semiconductor substrate.

5. The graphene nanoribbon array of claim 1, wherein the semiconductor substrate having a (001) facet is a germanium substrate.

6. The graphene nanoribbon array of claim 1, wherein the semiconductor substrate having a (001) facet is a semiconductor substrate.

7. The array of claim 1, wherein the graphene nanoribbons having their long axes oriented along a single [110] direction of the semiconductor are arranged in a regular pattern.

8. The array of claim 1, wherein the average width of the graphene nanoribbons in the array is no greater than 50 nm.

9. The array of claim 8, wherein the graphene nanoribbons having their long axes oriented along a single [110] direction of the semiconductor have a lateral spacing of no greater than 50 nm.

10. The array of claim 1, wherein the plurality of graphene nanoribbons comprises graphene nanoribbons having edges with an rms roughness of 1 nm or lower over edge lengths of at least 40 nm.

11. The array of claim 1 comprising at least 1000 of the graphene nanoribbons.

12. The array of claim 1, wherein the graphene nanoribbons do not comprise heterogeneous nucleation sites along their lengths.

13. The array of claim 1 comprising at least 1000 of the graphene nanoribbons, the graphene nanoribbons having an average width of no greater than 10 nm and a lateral spacing of no greater than 10 nm, wherein the graphene nanoribbons having their long axes oriented along a single [110] direction of the semiconductor are arranged in a regular pattern.

14. A graphene nanoribbon array comprising:
a semiconductor substrate having a (001) facet; and
a plurality of graphene nanoribbons on the (001) facet of the semiconductor substrate, each of the graphene nanoribbons comprising an amorphous carbon seed along its length;
wherein the graphene nanoribbons have aspect ratios of at least 4; and
wherein the graphene nanoribbons have the armchair crystallographic direction of graphene running all the way along their long axes with an armchair configuration along their edges; and
further wherein the graphene nanoribbons have their long axes oriented along a [110] direction of the semiconductor.

15. A method of growing graphene nanoribbons, the method comprising:
forming an array of graphene seeds on the (001) facet of a semiconductor substrate, wherein a majority of the graphene seeds have a single crystallographic orientation; and
growing graphene nanoribbons from the graphene seeds via chemical vapor deposition from a mixture of methane gas and hydrogen gas, wherein the partial pressures of the methane and hydrogen are selected to result in the growth of graphene nanoribbons having their long axes oriented along a [110] direction of the semiconductor substrate and their armchair edges running parallel with the [110] direction of the semiconductor substrate.

16. The method of claim 15, wherein at least 60% of the graphene nanoribbons are oriented along the same [110] direction of the semiconductor substrate.

17. The method of claim 15, wherein the step of forming an array of graphene seeds on the (001) facet of a semiconductor substrate comprises:
growing a sheet of monolayer graphene on a surface of a sheet-growth substrate;
transferring the sheet of monolayer graphene onto a (001) facet of a semiconductor substrate; and
patterning an array of graphene seeds into the sheet of monolayer graphene and removing the remainder of the sheet of monolayer graphene.

18. The method of claim 17, wherein the surface of the sheet-growth substrate is the (111) facet of a copper substrate.

19. The method of claim 15, wherein the graphene nanoribbons have an average width of no greater than about 10 nm.

20. The method of claim 15, further comprising incorporating the graphene nanoribbons and the semiconductor substrate into an electronic or photonic device.

21. The method of claim 15, further comprising releasing at least a portion of the graphene nanoribbons from the semiconductor substrate and transferring the released graphene nanoribbons to a second substrate.

* * * * *

UNITED STATES PATENT AND TRADEMARK OFFICE
CERTIFICATE OF CORRECTION

PATENT NO. : 9,761,669 B1
APPLICATION NO. : 15/212413
DATED : September 12, 2017
INVENTOR(S) : Michael Scott Arnold et al.

Page 1 of 1

It is certified that error appears in the above-identified patent and that said Letters Patent is hereby corrected as shown below:

In the Claims

Column 13, Lines 61-62, Claim 6:
Delete "(001) facet is a semiconductor substrate" and replace with --(001) facet is a III-V semiconductor substrate--

Signed and Sealed this
Twenty-first Day of August, 2018

Andrei Iancu
*Director of the United States Patent and Trademark Office*